(12) United States Patent
Nishiyama et al.

(10) Patent No.: US 8,080,868 B2
(45) Date of Patent: Dec. 20, 2011

(54) SEMICONDUCTOR MEMORY DEVICE AND SEMICONDUCTOR MEMORY CARD

(75) Inventors: Taku Nishiyama, Yokohama (JP); Naohisa Okumura, Yokohama (JP); Kiyokazu Okada, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/939,210

(22) Filed: Nov. 4, 2010

(65) Prior Publication Data

US 2011/0042467 A1 Feb. 24, 2011

Related U.S. Application Data

(63) Continuation of application No. 12/558,814, filed on Sep. 14, 2009, now Pat. No. 7,855,446.

(30) Foreign Application Priority Data

Oct. 31, 2008 (JP) ................................. 2008-280713

(51) Int. Cl.
*H01L 23/02* (2006.01)
(52) U.S. Cl. ........................................ 257/686; 257/777
(58) Field of Classification Search .................. 257/686, 257/777, 723, 724
See application file for complete search history.

(56) References Cited

U.S. PATENT DOCUMENTS

| | | | |
|---|---|---|---|
| 6,621,155 B1 | 9/2003 | Perino et al. | |
| 7,190,068 B2 * | 3/2007 | Hackitt et al. | 257/707 |
| 7,348,668 B2 | 3/2008 | Masuda et al. | |
| 2006/0261489 A1 | 11/2006 | Takemoto et al. | |
| 2007/0170573 A1 * | 7/2007 | Kuroda et al. | 257/686 |
| 2007/0228509 A1 | 10/2007 | Okada et al. | |
| 2008/0061421 A1 | 3/2008 | Shen et al. | |
| 2008/0174000 A1 | 7/2008 | Chen et al. | |
| 2009/0096075 A1 * | 4/2009 | Joh | 257/686 |
| 2009/0166839 A1 | 7/2009 | Suzuki et al. | |
| 2009/0230534 A1 | 9/2009 | Okada | |
| 2009/0256249 A1 | 10/2009 | Yu et al. | |
| 2010/0013074 A1 | 1/2010 | Corisis et al. | |
| 2010/0078793 A1 | 4/2010 | Mess et al. | |
| 2010/0133677 A1 | 6/2010 | Murayama et al. | |
| 2010/0301466 A1 * | 12/2010 | Taoka et al. | 257/686 |

FOREIGN PATENT DOCUMENTS

| | | |
|---|---|---|
| JP | 11-87609 | 3/1999 |
| JP | 2005-302871 | 10/2005 |
| JP | 2006-41258 | 2/2006 |
| JP | 2007-128953 | 5/2007 |
| JP | 2007-293800 | 11/2007 |
| JP | 2008-160119 | 7/2008 |

OTHER PUBLICATIONS

Office Action issued Feb. 22, 2011, in Japan Patent Application No. 2008-280713 (with English translation).

* cited by examiner

*Primary Examiner* — S. V Clark
(74) *Attorney, Agent, or Firm* — Oblon, Spivak, McClelland, Maier & Neustadt, L.L.P.

(57) ABSTRACT

A semiconductor memory card includes a wiring board which has a first pad region along a first long side and a second pad region along a second long side. First memory chips which configure a first chip group are stacked in a step-like shape on the wiring board. Second memory chips which configure a second chip group are stacked in a step-like shape on the first chip group with the direction reversed. The electrode pads of the first memory chips are electrically connected to the connection pads arranged on the first pad region, and the electrode pads of the second memory chips are electrically connected to the connection pads arranged on the second pad region.

6 Claims, 3 Drawing Sheets

SEMICONDUCTOR MEMORY DEVICE AND SEMICONDUCTOR MEMORY CARD

CROSS-REFERENCE TO RELATED APPLICATIONS

This application is a continuation application of U.S. application Ser. No. 12/558,814, filed Sep. 14, 2009 and is based upon and claims the benefit of priority from the prior Japanese Patent Application No. 2008-280713, filed on Oct. 31, 2008; the entire contents of each of which are incorporated herein by reference.

BACKGROUND OF THE INVENTION

A memory card (semiconductor memory card) having a NAND-type flash memory or the like is being downsized and provided with high capacity rapidly. For realization of a downsized memory card, semiconductor chips such as a memory chip and a controller chip are mounted in a stacked form on a wiring board. Besides, the memory chips have come to be often stacked into multiple layers on the wiring board. The electrode pads of the semiconductor chips are electrically connected to the connection pads of the wiring board through metal wires (bonding wires).

To realize a memory card with high capacity, provision of the memory chip itself with higher integration and higher capacity based on it is being conducted in addition to the improvement of the stacked structure of the semiconductor chips such as a memory chip and a controller chip on the wiring board. The outer shape of the memory chip tends to become large when it is provided with high capacity. The outer size of the memory card is specified by SD™ standard or the like. In addition, the outer circumference of the memory card is provided with a cutout portion to indicate the forward or backward direction and the front or rear surface direction of the card when it is fitted into a card slot (JP-A 2007-293800 (KOKAI)).

In a case where a large memory chip is mounted on a wiring board for the memory card, the connection between the wiring board and the memory chips might become difficult. It becomes a factor of restricting the number and size of the memory chips mountable on the wiring board. To perform wire bonding of plural memory chips, the plural memory chips are stacked in a step-like shape to expose the electrode pads arranged along their short sides (JP-A 2005-302871 (KOKAI)).

When the memory chips which have the electrode pads arranged along the short sides are stacked into a step-like shape, their length in the stepped direction becomes long with the increase in the number of stacked memory chips, and an occupied area of the semiconductor chips relative to the wiring board increases. It becomes a factor of restricting the number of memory chips mountable on the wiring board to disturb the provision of high capacity which is demanded for the memory card. In addition, the memory chip having a single-short-side pad structure might not be able to comply with an increase of the number of electrodes on the basis of the provision of high integration and high sophistication.

SUMMARY OF THE INVENTION

A semiconductor memory device according to an aspect of the present invention includes: a wiring board having a substantially rectangular outer shape, a first surface provided with an external connection terminal, and a second surface provided with a chip mounting section and connection pads arranged on a first pad region along a first long side and a second pad region along a second long side; a first chip group including a plurality of first memory chips stacked in a step-like shape in the chip mounting section of the wiring board, each of the first memory chips having electrode pads exposed and arranged along a long side which is located near the first pad region; a second chip group including a plurality of second memory chips stacked in a step-like shape on the first chip group in a direction opposite to a stepped direction of the first chip group, each of the second memory chips having electrode pads exposed and arranged along a long side which is located near the second pad region; first metal wires electrically connecting the connection pads arranged on the first pad region and the electrode pads of the first memory chips; second metal wires electrically connecting the connection pads arranged on the second pad region and the electrode pads of the second memory chips; and a sealing resin layer formed on the second surface of the wiring board to seal the first and second chip groups together with the first and second metal wires.

A semiconductor memory card according to a aspect of the present invention includes: a wiring board having a substantially rectangular outer shape, a first surface provided with an external connection terminal, and a second surface provided with a chip mounting section and connection pads arranged on a first pad region along a first long side and a second pad region along a second long side; a first chip group including a plurality of first memory chips stacked in a step-like shape on the chip mounting section of the wiring board, each of the first memory chips having electrode pads exposed and arranged along a long side which is located near the first pad region; a second chip group including a plurality of second memory chips stacked in a step-like shape on the first chip group in a direction opposite to a stepped direction of the first chip group, each of the second memory chips having electrode pads exposed and arranged along a long side which is located near the second pad region; a controller chip, stacked on the second chip group, having electrode pads arranged along at least one outline side; first metal wires electrically connecting the connection pads arranged on the first pad region and the electrode pads of the first memory chips; second metal wires electrically connecting the connection pads arranged on the second pad region and the electrode pads of the second memory chips; third metal wires electrically connecting the connection pads of the wiring board and the electrode pads of the controller chip; and a sealing resin layer formed on the second surface of the wiring board to seal the first and second chip groups and the controller chip together with the first, second and third metal wires.

A semiconductor memory card according to another aspect of the present invention includes: a wiring board having a substantially rectangular outer shape with a first long side, a second long side, a first short side and a second short side, a cutout portion formed at a corner portion between the first long side and the first short side, a first surface provided with a external connection terminal, and a second surface provided with a chip mounting section and connection pads arranged on a first pad region along a portion excluding the cutout portion of the first long side and on a second pad region along the second long side; a first chip group including a plurality of first memory chips stacked in a step-like shape on the chip mounting section of the wiring board, each of the first memory chips having electrode pads exposed and biasly arranged toward the second short side of the wiring board along a long side which is located near the first pad region; a second chip group including a plurality of second memory chips stacked in a step-like shape on the first chip group in a direction opposite to a stepped direction of the first chip group, each of the second memory chips having electrode pads exposed and arranged along a long side which is located near the second pad region; a controller chip, stacked on the second chip group, having electrode pads arranged along at least one outline side; first metal wires electrically connecting the connection pad arranged on the first pad region and the electrode pads of the first memory chips; second metal wires electrically connecting the connection pads arranged on the second pad region and the electrode pads of the second memory chips; third metal wires electrically connecting the connection pads of the wiring board and the electrode pads of the controller chip; and a sealing resin layer formed on the second surface of the wiring board to seal the first and second chip groups and the controller chip together with the first, second and third metal wires.

DETAILED DESCRIPTION OF THE INVENTION

Figure 1:
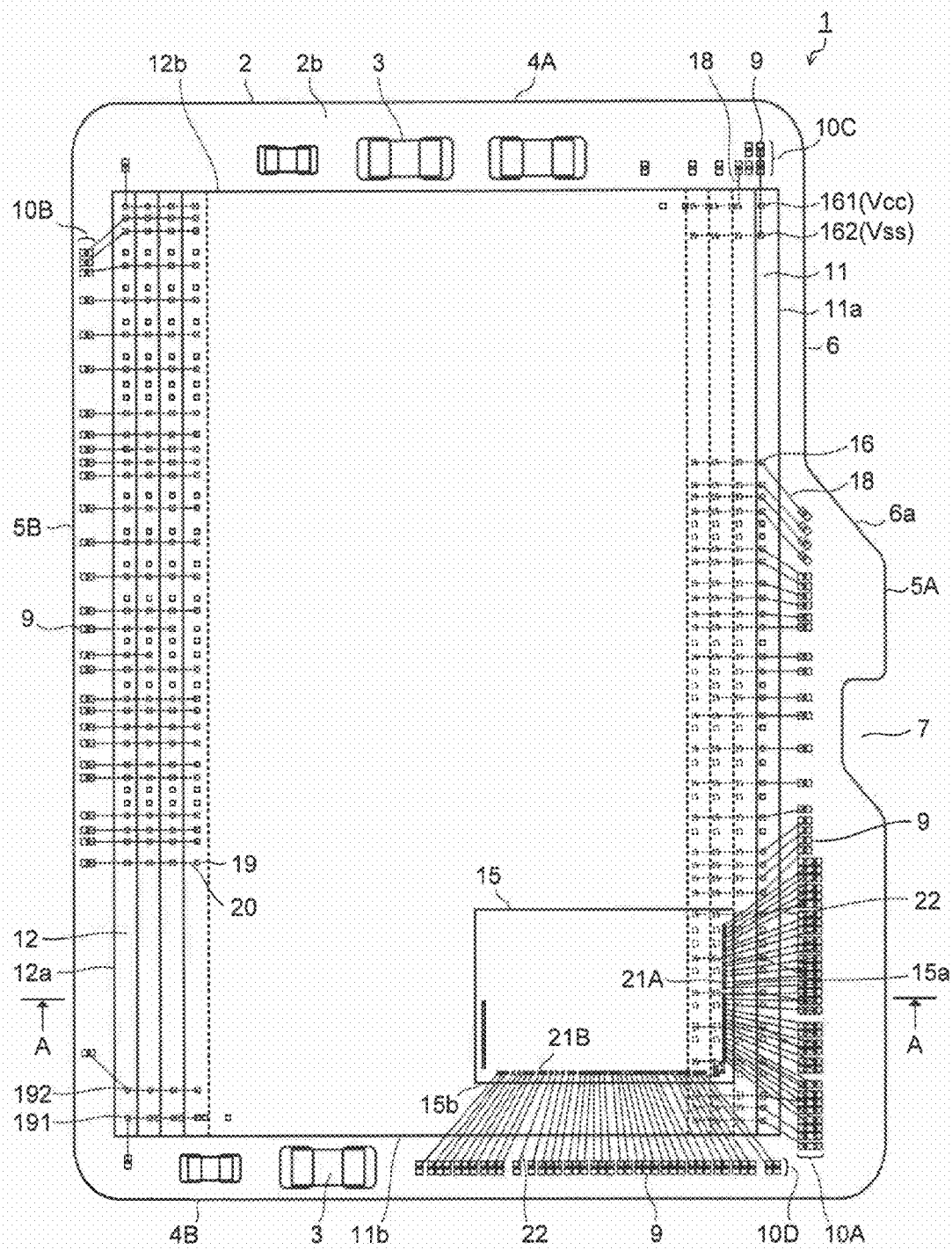
FIG. 1 is a plan view showing a semiconductor memory card according to a first embodiment.
Figure 2:
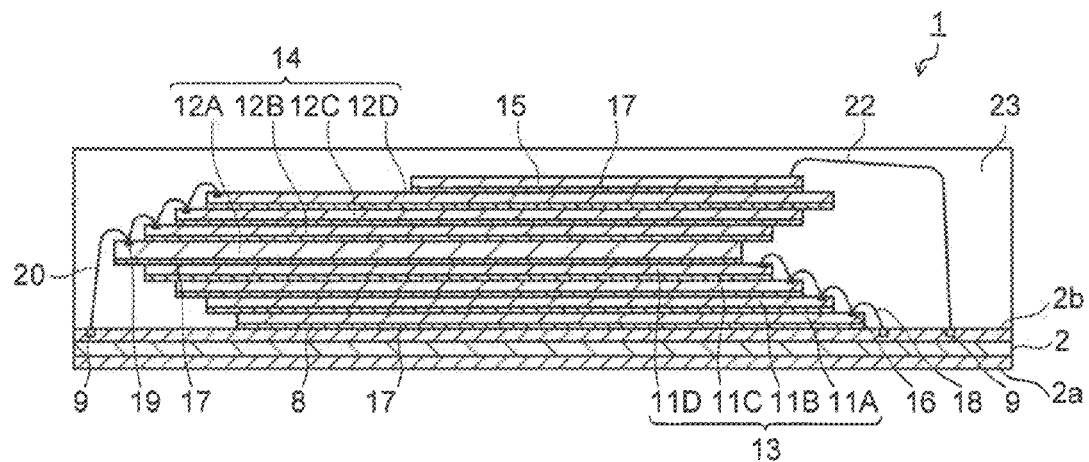
FIG. 2 is a sectional view taken along line A-A of FIG. 1.

Modes of conducting the present invention will be described with reference to the drawings. FIG. 1 and FIG. 2 are views showing a semiconductor memory card (semiconductor memory device) according to a first embodiment of the invention. FIG. 1 is a plan view of the semiconductor memory card, and FIG. 2 is a sectional view (sectional view of the memory card cut in the direction of its short side) taken along line A-A of FIG. 1. The semiconductor memory card 1 shown in the drawings is used as, for example, a micro SD™ standard memory card.

The memory card 1 is provided with a wiring board 2 which serves as a chip-mounting substrate and terminal-forming substrate. For example, the wiring board 2 has wiring networks formed within and on the front surface of an insulating resin substrate, and specifically a printed circuit board using a glass-epoxy resin, a BT resin (bismaleimide triazine resin) or the like is applied. The wiring board 2 has a first surface 2a which becomes a terminal formation surface and a second surface 2b which becomes a chip-mounted surface. Chip parts 3 such as a chip capacitor and a fuse are mounted on the second surface 2b of the wiring board 2.

The wiring board 2 has a substantially rectangular outer shape. Among the outline sides of the wiring board 2, a first short side 4A corresponds to a leading end of the memory card 1 when it is inserted into a card slot. A second short side 4B corresponds to the rear end of the memory card 1. A first long side 5A of the wiring board 2 has a cutout portion 6 and a recess portion 7 to indicate the forward or backward direction and the front or rear surface direction of the memory card 1. The cutout portion 6 is formed along the first long side 5A from the corner portion between the first short side 4A and the first long side 5A such that the width of the first short side 4A becomes smaller than that of the second short side 4B.

The wiring board 2 has the cutout portion 6 which is formed by partially cutting out the first long side 5A including the corner portion (virtual corner portion) between the first long side 5A and the first short side 4A. An end portion 6a of the cutout portion 6 is inclined to have an obtuse angle. The wiring board 2 has the recess portion 7 which is formed by partially recessing the first long side 5A into a substantially trapezoidal shape. Each corner of the wiring board 2 is rounded to have an R-shape. The chip parts 3 are arranged along both the short sides 4A, 4B of the wiring board 2. The cutout portion 6 is not limited to a particular shape but may have any shape if it is formed by partially cutting the first long side 5A.

The substantially rectangular profile of the wiring board 2 has an unsymmetric shape because the cutout portion 6 and the recess portion 7 are formed in the first long side 5A. Therefore, a region effective for mounting a rectangular memory chip described later is a rectangular region parallel to a second long side 5B excluding a portion continuous from the cutout portion 6 (portion which remains when the cutout portion 6 is formed and is parallel to the long side 5A). The short sides 4A, 4B of the wiring board 2 become regions excluding the mounting regions for the chip parts 3.

External connection terminals (not shown) which become input/output terminals of the memory card 1 are formed on the first surface 2a of the wiring board 2. The external connection terminals are configured of a metal layer which is formed by electrolytic plating or the like. The first surface 2a of the wiring board 2 corresponds to the front surface of the memory card 1. The first surface 2a of the wiring board 2 is provided with a first wiring network (not shown) in a region excepting a region where the external connection terminals are formed. The first wiring network has test pads of the memory card 1. The first wiring network is covered with an insulating layer (not shown) using an adhesive seal or an adhesive tape.

The second surface 2b of the wiring board 2 has a chip mounting section 8 and a second wiring network including connection pads 9. The second surface 2b of the wiring board 2 corresponds to the back surface of the memory card 1. The chip mounting section 8 is disposed parallel to the second long side 5B and on the rectangular region excluding the mounting region for the chip parts 3. Thus, the chip mounting area can be increased. The second wiring network having the connection pads 9 is electrically connected to the external connection terminals and the first wiring network through unshown internal wirings (such as through holes) of the wiring board 2.

The connection pads 9 are arranged on a first pad region 10A along the first long side 5A, a second pad region 10B along the second long side 5B, a third pad region 10C along the first short side 4A and a fourth pad region 10D along the second short side 4B. The first pad region 10A is determined to be a rectangular region parallel to the remaining portion of the first long side 5A which is provided with the cutout portion 6. The connection pads 9 are arranged along the remaining portion of the first long side 5A. The second pad region B is determined to be a region parallel to the second long side 5B.

Plural memory chips 11, 12 are mounted by stacking on the chip mounting section 8 of the wiring board 2. The memory chips 11 configure a first chip group 13, and the memory chips 12 configure a second chip group 14. A semiconductor memory chip such as a NAND-type flash memory is used for the memory chips 11, 12. A controller chip 15 is stacked on the memory chip 12. The controller chip 15 is a semiconductor chip which selects a chip to write and read data to and from the plural memory chips 11, 12, writes data into the selected memory chips 11, 12, or reads data which is stored in the selected memory chips 11, 12.

A first memory chip 11A, a second memory chip 11B, a third memory chip 11C and a fourth memory chip 11D which configure the first chip group 13 are sequentially stacked on the second surface 2b of the wiring board 2. The first through fourth memory chips 11A to 11D have the same rectangular shape and are provided with electrode pads 16. The electrode pads 16 are arranged along a long side 11a which is located near the first long side 5A of the wiring board 2. Since the first pad region 10A is disposed on the remaining portion of the first long side 5A excepting the cutout portion 6, the electrode pads 16 are biased to correspond with the first pad region 10A.

The electrode pads 16 of the memory chip 11 are biasly arranged toward a short side 11b along the long side 11a and to correspond with the arrangement positions of the connection pads 9 in the first pad region 10A. In a region along the long side 11a of the memory chip 11, no electrode pad is arranged on a portion positioned near the cutout portion 6, and the electrode pads 16 are biased toward a portion corresponding to the first pad region 10A (portion positioned near the first pad region 10A). The memory chip 11 has a bias type single-long-side pad structure.

When the electrode pads 16 of the memory chip 11 are biased toward the short side 11b, the connection between the first pad region 10A effective to increase the area of the chip mounting section 8 and the memory chip 11 can be secured. In other words, the large memory chip 11 is mounted on the chip mounting section 8, and it becomes possible to connect the electrode pads 16 arranged along the long side 11a of the memory chip 11 to comply with an increase of the number of electrodes and the connection pads 9 of the first pad region 10A.

Since the first pad region 10A is biased toward the short side 4B, all the connection pads 9 and the electrode pads 16 cannot be wire bonded when the electrode pads 16 are arranged equally on the long side 11a of the memory chip 11. Meanwhile, since the memory chip 11 has the bias type single-long-side pad structure, the electrode pads 16 can be connected securely to the connection pads 9 of the first pad region 10A which is biased toward the short side 4B.

The end 6a of the cutout portion 6 of the wiring board 2 is inclined, and a portion formed along the end portion 6a is determined as a inclined region. To use the inclined region, which is based on the inclined end 6a of the cutout portion 6, as a pad region, the connection pads 9 which are on the inclined region are arranged along the inclined angle of the end 6a of the cutout portion 6. Thus, the connection pads 9 which are arranged on the inclined region are determined to have a shape along the inclined angle of the end 6a, so that the first pad region 10A can be used more effectively. In other words, it becomes possible to increase the number of the electrode pads 16 arranged along the long side 11a of the memory chip 11.

The first memory chip 11A is adhered with its surface (chip formation surface) having the electrode pads 16 directed upward to the chip mounting section 8 of the wiring board 2 via an adhesive layer 17. The first memory chip 11A is arranged with its pad arrangement side (long side 11a) directed to the first long side 5A of the wiring board 2. For the adhesive layer 17, a die attach film (adhesive agent film) which is mainly composed of a general polyimide resin, epoxy resin, acrylic resin or the like is used. Other memory chips 11B to 11D, 12A to 12D are also bonded via the same adhesive layer 17.

The second memory chip 11B is adhered onto the first memory chip 11A to expose the electrode pads 16 of the first memory chip 11A. Similarly, the third memory chip 11C is adhered onto the second memory chip 11B, and the fourth memory chip 11D is adhered onto the third memory chip 11C. The second through fourth memory chips 11B to 11D are sequentially stacked in a step-like shape on the first memory chip 11A in the same direction of the pad arrangement sides (long sides 11a) with the first memory chip 11A to expose electrode pads 16 of the lower memory chip 11.

The first to fourth memory chips 11A to 11D are stacked in a step-like shape with their pad arrangement sides (long side 11a) directed in the same direction and the short sides aligned. They are displaced in the short side direction to expose the electrode pads 16 of the lower memory chip 11. Therefore, the electrode pads 16 of the first to fourth memory chips 11A to 11D are positioned near the first pad region 10A in a state exposed upward. The electrode pads 16 of the first to fourth memory chips 11A to 11D are electrically connected to the connection pads 9 arranged in the first pad region 10A through first metal wires 18.

When the electrode pads 16 of the first through fourth memory chips 11A to 11D have the same electric properties and signal characteristics, they can be connected sequentially by the first metal wires 18. A Au wire or Cu wire is used for the metal wire 18. It is preferable that the metal wires 18 are wire bonded by applying reverse bonding capable of decreasing a loop height. Metal bumps are previously formed on the electrode pads 16. One ends of the metal wires 18 are ball connected to the connection pads 9, and the other ends of the metal wires 18 are connected to the metal bumps formed on the electrode pads 16.

The fifth memory chip 12A, the sixth memory chip 12B, the seventh memory chip 12C and the eighth memory chip 12D which configure the second chip group (memory chip group) 14 are sequentially stacked on the first chip group 13. The fifth to eighth memory chips 12A to 12D have the same rectangular shape as the first to fourth memory chips 11A to 11D, each having electrode pads 19 arranged along a long side 12a. The electrode pads 19 of the fifth to eighth memory chips 12A to 12D are biasly arranged similarly as the electrode pads 16 of the first to fourth memory chips 11A to 11D. The electrode pads 19 of the fifth to eighth memory chips 12A to 12D are biased toward the short side 12b.

Thus, the first to fourth memory chips 11A to 11D and the fifth to eighth memory chips 12A to 12D have the same outer shape and the same bias type pad arrangement (arrangement of the electrode pads 16, 19). The memory chips 11A to 11D, 12A to 12D are memory chips having the same structure and the same bias type single-long-side pad structure. The fifth to eighth memory chips 12A to 12D are arranged in a state inverted by 180° from the first to fourth memory chips 11A to 11D.

The first to fourth memory chips 11A to 11D are arranged such that the short side 11b is positioned on the side of the second short side 4B of the wiring board 2, and the fifth to eighth memory chips 12A to 12D are arranged such that the short side 12b is positioned on the side of the first short side 4A of the wiring board 2. Based on such an inverted arrangement structure, the electrode pads 19 of the fifth to eighth memory chips 12A to 12D are biased toward the first short side 4A of the wiring board 2. The second pad region 10B of the wiring board 2 corresponds to the pad arrangement shapes of the fifth to eighth memory chips 12A to 12D, and the connection pads 9 are mainly arranged toward the first short side 4A.

The fifth memory chip 12A is adhered onto the fourth memory chip 11D which is positioned on the top of the first chip group 13 via the adhesive layer 17 with its surface having the electrode pads 19 directed upward. The fifth memory chip 12A is stacked to be displaced in the direction of the short side so as to expose the electrode pad 16 of the fourth memory chip 11D. The fifth memory chip 12A is arranged with a pad arrangement side (long side 12a) directed toward the second long side 5B of the wiring board 2. The fifth memory chip 12A is arranged in a direction opposite to the first memory chip 11A. The electrode pads 19 are located near the second pad region 10B.

The sixth memory chip 12B is adhered onto the fifth memory chip 12A to expose the electrode pads 19 of the fifth memory chip 12A. Similarly, the seventh memory chip 12C is adhered onto the sixth memory chip 12B, and the eighth memory chip 12D is adhered onto the seventh memory chip 12C. The sixth to eighth memory chips 12B to 12D are sequentially stacked in a step-like shape onto the fifth memory chip 12A with the pad arrangement side (long side 12a) directed to the same direction as the fifth memory chip 12A to expose the electrode pads 19 of the lower memory chip 12.

The second chip group 14 is stacked in a step-like shape with the pad arrangement sides (long side 12a) directed to a direction opposite to the first chip group 13 in a direction opposite to the stepped direction of the first chip group 13 (direction toward the upper level of the chips stacked in the step-like shape). The fifth to eighth memory chips 12A to 12D are stacked in the step-like shape with their pad arrangement sides 12a directed to the same direction and their short sides aligned. And, they are displaced in a direction opposite to the first chip group 13 to expose the electrode pads 19 of the lower memory chip 12.

The electrode pads 19 of the fifth to eighth memory chips 12A to 12D are located near the second pad region 10B in a state exposed upward. The electrode pads 19 of the fifth to eighth memory chips 12A to 12D are electrically connected to the connection pads 9, which are arranged on the second pad region 10B, through second metal wires 20. When the electrode pads 19 of the fifth to eighth memory chips 12A to 12D have the same electric properties and signal characteristics, they can be connected sequentially by the second metallic wires 20. It is preferable that the metal wires 20 are bonded by applying reverse bonding.

In a case where a bias type single-long-side pad structure is applied to the memory chip 11, the power source terminals (Vcc and Vss) are also biasly formed, therefore possibly affecting adversely on an operation property of the memory chip 11. In such a case, it is effective to arrange the power electrode pads 16 at the corners of the memory chips 11. FIG. 1 shows that power electrode pads 161 (Vcc), 162 (Vss) are arranged at the corner portions away from the electrode pads 16 which are biased on the memory chips 11. Independent of the biased electrode pads 16, the power electrode pads 161, 162 are arranged at the corners of the memory chips 11 (corners on the short side opposed to the short side 11b where the electrode pads 16 are biased), so that an operation property of the memory cell array of the memory chips 11 can be improved.

Incidentally, since the power electrode pads 161, 162 which are arranged at the corners of the memory chips 11 are located near the cutout portion 6 of the wiring board 2, they cannot be connected to the connection pads 9, which are disposed along the first long side 5A of the wiring board 2, similar to the other electrode pads 16. In other words, a region for disposing the connection pads 9 cannot be secured between the power electrode pads 161, 162 and the outline side of the wiring board 2. On this point, it is effective to electrically connect the power electrode pads 161, 162 to the connection pads 9 in the third pad region 10C, which is disposed on the first short side 4A of the wiring board 2, via the metal wires 18.

The electrode pads 16 which are biased to the short side 11b of the memory chip 11 are wire bonded toward the first long side 5A of the wiring board 2, while the power electrode pads 161, 162 are wire bonded toward the first short side 4A of the wiring board 2. In this case, when the metal wires 18 which are connected to the electrode pads 161 (Vcc) located near the corners are wired toward the connection pads 9 on the third pad region 10C, the metal wires 18 which connect between the first memory chip 11A and the fourth memory chip 11D become obstacles, and wiring cannot be made from the electrode pads 162 (Vss) to the connection pads 9.

It is considered that the metal wires are connected to the electrode pads 16 of the fourth memory chip 11D and wired toward the connection pads 9 within the third pad region 10C, but the metal wires 18 connecting between the first memory chip 11A and the fourth memory chip 11D also become obstacles. In addition, it is also considered that metal wires for the substrate are connected to relay pads which are connected to the electrode pads 16 of the fourth memory chip 11D through the wires in the chip and wired toward the connection pads 9 within the third pad region 10C. But, since the fifth memory chip 12A is stacked on the fourth memory chip 11D, the relay pads cannot be arranged at a position where the metal wires 18 do not become an obstacle.

Figure 3:
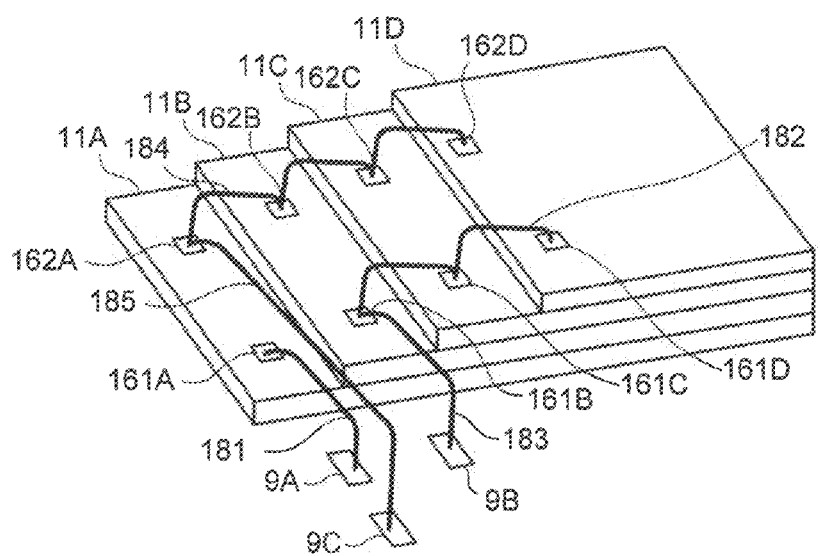
FIG. 3 is a perspective view showing a wire bonding structure of electrode pads which are near corner portions of memory chips on the semiconductor memory card shown in FIG. 1.

The wiring structure shown in FIG. 3 is effective for the above-described case. FIG. 3 shows a structure that a metal wire 181 connects between an electrode pad 161A of the first memory chip 11A and the connection pad 9A, a metal wire 182 connects between the second memory chip 11B and the fourth memory chip 11D, and a metal wire 183 connects between an electrode pad 161B of the second memory chip 11B and the connection pad 9B. By configuring in this way, wiring can be made from the electrode pads 162 to the connection pads 9 without any obstacle.

For electrode pads 162A to 162D of the first to fourth memory chips 11A to 11D, a metal wire 184 connects between the electrode pad 162A of the first memory chip 11A and the electrode pad 162D of the fourth memory chip 11D, and a metal wire 185 connects between the electrode pad 162A and the connection pad 9C. The connection pad 9C is arranged outside of the connection pad 9A to make it possible to wire the metal wire 185.

By applying the wiring structure shown in FIG. 3, the electrode pads 161, 162 which are arranged near the corners of the memory chips 11 can be connected to the connection pads 9 within the third pad region 10C disposed toward the first short side 4A of the wiring board 2. For wire bonding to the electrode pads 161, the metal wires 181, 182 are sequentially bonded, and thereafter the metal wire 183 is bonded. Wire bonding to the electrode pads 162 is performed after the metal wires 181, 182, 183 are connected to the electrode pads 161. First, the metal wire 185 is bonded, and then the metal wire 184 is bonded.

Figure 4:
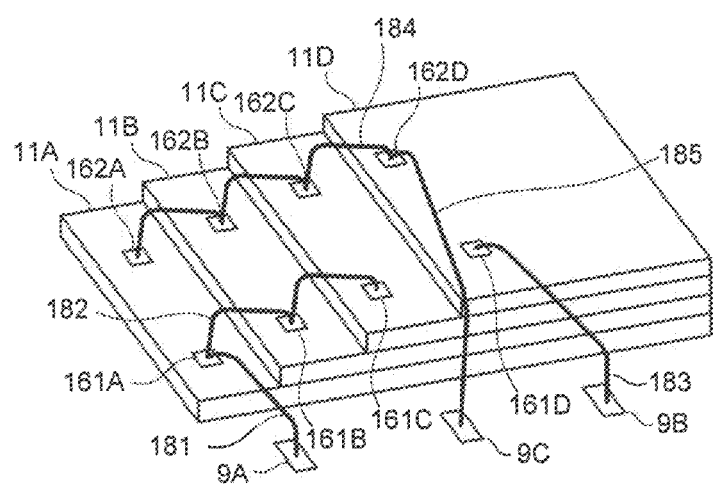
FIG. 4 is a perspective view showing another wire bonding structure of electrode pads which are near the corner portions of the memory chips on the semiconductor memory card of FIG. 1.

In the wiring structure shown in FIG. 4, the metal wire 181 connects between the electrode pad 161A of the first memory chip 11A and the connection pad 9A, and the metal wire 182 connects between the electrode pad 161A of the first memory chip 11A and the electrode pad 161C of the third memory chip 11C, and then the metal wire 183 connects between the electrode pad 161D of the fourth memory chip 11D and the connection pad 9B.

In the above case, the metal wire 184 connects between the electrode pad 162A of the first memory chip 11A and the electrode pad 162D of the fourth memory chip 11D, and the metal wire 185 connects between the electrode pad 162D of the fourth memory chip 11D and the connection pad 9C, thereby enabling to connect the electrode pads 161, 162 to the connection pads 9.

The wiring structure shown in FIG. 4 has a possibility that the metal wire 185 is contacted to an end portion of the fourth memory chip 11D or an edge portion of the third memory chip 11C. In the wiring structure shown FIG. 4, the connection pad 9C can be arranged outside of the connection pad 9B, but wire sweeping (falling of the wire) tends to be caused because the wire has a high height. Therefore, the wiring structure shown in FIG. 3 is more advantageous than the structure shown in FIG. 4, and the connection reliability between the electrode pads 161, 162 and the connection pads 9 can be enhanced.

In the wiring structures shown in FIG. 3 and FIG. 4, the plural metal wires 181, 183 are used to connect between the connection pads 9 and the electrode pads 161A to 161D close to the pad region 10C among the electrode pads 161, 162 arranged near the corner portions of the first to fourth memory chips 11A to 11D, and the connection among the electrode pads 161A to 161D is partly omitted, and therefore the connection spaces (wiring spaces) between the connection pads 9 and the electrode pads 162A to 162D which are away from the pad region 10C are secured. Thus, it becomes possible to improve the connectability between the connection pads 9 and the electrode pads 161, 162 which are arranged near the corner portions, and its reliability.

For the fifth to eighth memory chips 12A to 12D configuring the second chip group 14, it is effective to electrically connect a part of electrode pads 191, 192 which are arranged near the corner portions to the connection pads 9 within the fourth pad region 10D disposed toward the second short side 4B of the wiring board 2 through the metal wires 20. When it is determined that the corner portions of the wiring board 2 are rounded to have an R-shape, the fabrication is performed with laser processing. Since a conductive material is produced because of carbonization or the like of the substrate material when the laser processing is performed, it is preferable that a predetermined area from the corner portion is determined to be a non-wiring region. Even in this case, the electrode pads 191 and the connection pads 9 can be connected by wiring from the electrode pad 191 to the second short side 4B of the wiring board 2.

The memory chips 11, 12 are not limited to have a limited thickness, but it is preferable that they are made thin in order to increase the number of the memory chips 11, 12 mounted on the memory card 1. A problem might be caused if all the memory chips 11, 12 are made uniformly thin. In the second chip group 14, the lowermost fifth memory chip 12A is displaced from the fourth memory chip 11D, and its end portion having the electrode pads 19 is in a state of protruding from the memory chip 11D (overhanging state). Therefore, the end portion of the memory chip 12A might be warped by wire bonding to the electrode pads 19 to cause a defective connection of the metal wire 20 or a chip crack.

It is preferable that the fifth memory chip 12A has a thickness larger than that of the memory chip 12B positioned on its upper level (immediately above). Thus, a defective connection or a chip crack can be prevented from occurring at the time of wire bonding to the electrode pads 19 of the fifth memory chip 12A. The uppermost eighth memory chip 12D tends to be warped. Therefore, it is preferable that the eighth memory chip 12D has a thickness larger than that of the memory chip 12C positioned on its lower level (immediately below).

Among the memory chips 11A to 11D configuring the first chip group 13, the lowermost first memory chip 11A is positioned on an uneven portion (uneven portion resulting from a level difference due to the presence or not of a wiring layer or resulting from a level difference due to a through hole portion) present on the surface 2b of the wiring board 2. Therefore, there is a possibility that a high pressure is locally applied at the time of resin sealing to cause cracks. It is preferable that the first memory chip 11A has a thickness larger than that of the memory chip 11B positioned on its upper level (immediately above). Thus, it becomes possible to prevent the first memory chip 11A from being cracked by the localized pressure caused at the time of molding of a sealing resin.

The memory chips 12B, 12C other than the lowermost chip 12A and uppermost chip 12D of the second chip group 14 and the memory chips 11B to 11D other than the lowermost chip 11A of the first chip group 13 have thickness T which is preferably made thin in a range that the productivity and wire bonding property of the memory chips 11, 12 are not impaired in order to prevent the stacked thickness of the memory chips 11, 12 from increasing and their stacked number from decreasing. The thickness T is preferably in a range of 10 to 50 µm. If the memory chips 11B to 11D, 12B to 12C have the thickness T of exceeding 50 µm, the stacked thickness becomes excessively thick. Meanwhile, it is hard to have the thickness T of less than 10 µm from a viewpoint of the chip production process, and cracks are easily caused during the production or handling.

Thickness T1 of the lowermost memory chip 12A of the second chip group 14 is preferably in a range of 2.5 to 3.5 T with respect to the thickness T of the other memory chips 12. If the thickness T1 is excessively thin, a defective connection or a chip crack might not be suppressed. Although the bonding property can be improved better when the thickness T1 is increased, but if it is excessively increased, the stacked thickness is increased. In addition, thickness T2 of the uppermost memory chip 12D is preferably in a range of 1.1 to 1.5 T with respect to the thickness T of the other memory chips 12. Thickness T3 of the lowermost memory chip 11A of the first chip group 13 is preferably in a range of 1.5 to 2.5 T with respect to the thickness T of the other memory chips 11.

In this embodiment, the thickness of the fifth memory chip 12A is increased to prevent a defective connection or a chip crack from occurring at the time of wire bonding to the electrode pad 19. Instead, the fifth memory chip 12A can be arranged immediately above the fourth memory chip 11D to avoid an overhang state, thereby enabling to prevent a defective connection or a chip crack from occurring at the time of wire bonding. But, when the above-described adhesive layer is applied in such a case, the fifth memory chip 12A interferes with the metal wire 18 connected to the fourth memory chip 11D, and a defect such as a short circuit or the like might be caused.

To dispose the fifth memory chip 12A immediately above the fourth memory chip 11D, the end portions of the metal wires 18 connected to the electrode pads 16 of the fourth memory chip 11D are effectively buried in the adhesive layer of the fifth memory chip 12A. Since the metal wire 18 connected to the fourth memory chip 11D is separated from the fifth memory chip 12A based on the thickness of the adhesive layer to prevent a contact between the metal wires 18 and the fifth memory chip 12A. The adhesive layer also has a function as a spacer layer.

In the stacked structure, the adhesive layer of the fifth memory chip 12A is formed of an insulation resin which has an adhesive function and a function that it becomes soft at a bonding temperature to take the metal wires 18 into it. As an example of such an insulating resin, there is used a thermoplastic resin such as acrylic resin or a thermosetting resin such as epoxy resin. It is preferable that the adhesive layer has a thickness in a range of 30 to 100 μm. If the adhesive layer has a thickness of less than 30 μm, there is a possibility that the contact of the metal wire 18 and the fifth memory chip 12A cannot be prevented. If the adhesive layer has a thickness of more than 100 μm, the stacked thickness of the memory chips 11, 12 is increased.

The controller chip 15 is stacked on the second chip group 14. The controller chip 15 is adhered onto the eighth memory chip 12D via the adhesive layer 17. The controller chip 15 has an L-shaped pad structure. The controller chip 15 is provided with electrode pads 21A which are arranged along a first side (short side) 15a located near the long side 5A of the wiring board 2 and electrode pads 21B which are arranged along a second side (long side) 15b located near the short side 4B of the wiring board 2. The electrode pads 21A, 21B are electrically connected to the connection pads 9 through third metal wires 22.

The electrode pads 21A arranged along the short side 15a of the controller chip 15 are electrically connected to the connection pads 9 arranged in the first pad region 10A through the metal wires 22. The electrode pads 21B arranged along the long side 15b of the controller chip 15 are electrically connected to the connection pads 9 arranged in the fourth pad region 10D through the metal wires 22. On the first pad region 10A, the connection pads 9 for the memory chip 11 and the connection pads 9 for the controller chip 15 are arranged.

A sealing resin layer 23 which is formed of, for example, epoxy resin is mold-formed on the second surface 2b of the wiring board 2 on which the memory chips 11, 12 and the controller chip 15 are mounted. The memory chips 11, 12 and the controller chip 15 are integrally sealed together with the metal wires 18, 20, 22 by the sealing resin layer 23. A slope portion indicating the front of the memory card is formed on a leading end of the sealing resin layer 23. A tab is formed at a rear part of the sealing resin layer 23 by partially protruding the sealing resin. The memory card 1 of the first embodiment is comprised of the above component elements. It should be noted that the sealing resin layer 23 is not shown in FIG. 1.

The memory card 1 configures solely a semiconductor memory card (e.g., micro SD™ card) without using a housing case such as a base card. Therefore, the sealing resin layer 23 is in a state directly exposed outside. In other words, the memory card 1 is a casing-less semiconductor memory card that the sealing resin layer 23 is exposed outside. The cutout portion 6, the recess portion 7 and the slope portion indicating the forward and backward direction and the front and rear surface direction of the described memory card 1 are formed on the memory card 1 itself (specifically, the wiring board 2 and the sealing resin layer 23).

For the memory card 1 of this embodiment, since the pad regions 10A, 10B are arranged along both the long sides 5A, 5B of the wiring board 2 and a single-long-side pad structure is applied to the memory chips 11, 12, it becomes possible to maintain the connection between the wiring board 2 and the memory chips 11, 12 after complying with the increase in the number of electrodes of the memory chips 11, 12. In addition, since the memory chips 11, 12 are stacked into multiple layers respectively, the number of chips mounted on the wiring board 2 for the memory card 1 having a specified outside dimension can be increased.

In addition, since the electrode pads 16, 19 of the memory chips 11, 12 are biased, the memory chips 11, 12 having a size as large as possible can be mounted on the chip mounting section (region where the chips can be mounted in practice) 8 of the wiring board 2, and then the connection pads 9 of the wiring board 2 and the electrode pads 16, 19 of the memory chips 11, 12 can be connected well through the metal wires 18, 20. Thus, the memory card 1 provided with high capacity by stacking the memory chips 11, 12 having the increased chip size can be realized. In other words, the memory card 1 which is small and has high capacity and high practical utility can be provided.

For example, according to the micro SD™ card standard based on the SD™ standard, the short side (second short side 4B) of the wiring board 2 has a length of 11 mm, the long side (second long side 5B) has a length of 15 mm, and the cutout portion 6 has a width (width parallel to the short side 4A) of 1.3 mm, a length (length parallel to the long side 5A) of 6.4 mm and an angle of 135°. Therefore, the region where the memory chips 11, 12 can be mounted has a size of 9.7×15 mm. But, a region where the chip parts 3 are mounted is required on the side of the short sides 4A, 4B of the wiring board 2, and the long side of the wiring board 2 needs the width of the second pad region 10B and a gap with the memory chip 11.

For the chip mounting section 8 of the wiring board 2 with the above points taken into consideration, even when the offset amount of the memory chips 11, 12 (e.g., offset amount from the first memory chip 11A to the fourth memory chip 11D is 310 μm, and the offset amount of the fifth memory chip 11D to the fourth memory chip 11D is 280 μm) is deducted, it becomes possible to mount the large memory chips 11, 12. In addition, since the stepped directions of the first chip group 13 and the second chip group 14 are reversed, the memory chips 11, 12 can be mounted with their number doubled.

The memory card 1 has a thickness equal to a total of the stacked thickness of the memory chips 11, 12 and the controller chip 15, the thickness of the wiring board 2 and the thickness (resin thickness on the chip) of the sealing resin layer 23 on the controller chip 15. When it is assumed that the wiring board 2 has a thickness of 124 μm, the first-stage memory chip 11A has a thickness of 60 μm, its adhesive layer has a thickness of 20 μm, the second to fourth-stage and sixth to seventh-stage memory chips 11B to 11D, 12B to 12C have a thickness of 28 μm, their adhesive layer has a thickness of 5 μm, the fifth-stage memory chip 12A has a thickness of 92 μm, its adhesive layer has a thickness of 10 μm, the eighth-stage memory chip 12D has a thickness of 36 μm, its adhesive layer has a thickness of 5 pm, the controller chip 15 has a thickness of 35 μm, its adhesive layer has a thickness of 5 μm, and the resin thickness on the chip is 148 μm, the total thickness becomes 700 μm which is within the specified thickness.

Using eight memory chips 11, 12 having a 2-GB storage capacity realized by improving the recording density and increasing the chip size as described above, a 16-GB micro SD™ card (semiconductor memory card 1) can be realized. In addition, the semiconductor memory chips 11, 12 such as a NAND-type flash memory are being provided with higher capacity by applying the multilevel technology (2 bits/cell, 3 bits/cell, 43 bits/cell, etc.). The memory card 1 of this embodiment is also effective for the NAND-type flash memory having memory cells for storing multivalue data. By configuring in this way, the memory card 1 can be downsized and provided with high capacity.

FIG. 1 and FIG. 2 show the memory card 1 that the first and second chip groups 13, 14 each are configured of four memory chips 11, 12 (eight of them in total), but the mountable number of the memory chips 11, 12 is not limited to the above. The individual chip groups 13, 14 may be configured of two or more memory chips 11, 12, which are not limited to a particular number. In addition, the number of the chip groups 13, 14 is not limited to two but may be two or more. The chip group in this case is a group of memory chips which are stacked into a stepped shape in one direction, and such a group number is determined to be the number of the chip groups.

Figure 5:
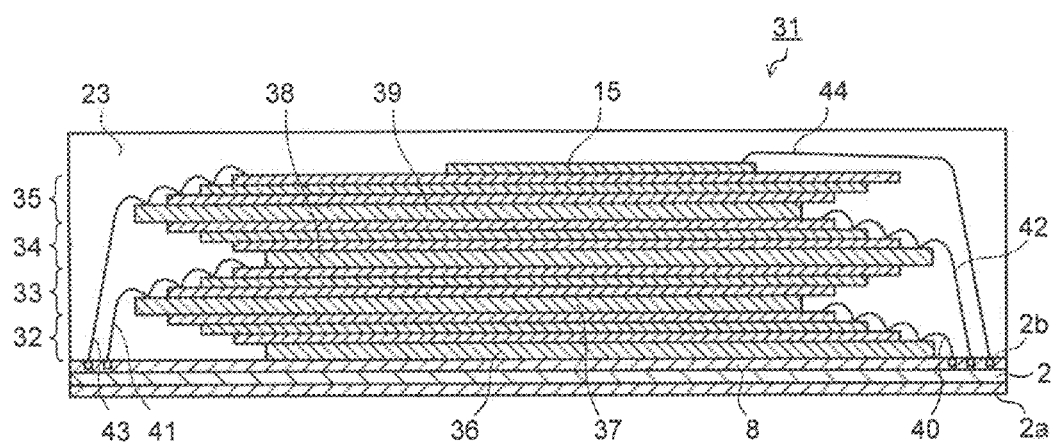
FIG. 5 is a sectional view showing a semiconductor memory card according to a second embodiment.

The semiconductor memory card according to a second embodiment of the invention is described below with reference to FIG. 5. FIG. 5 is a sectional view (sectional view of the memory card cut in the direction of the short side) showing the semiconductor memory card (semiconductor memory device) according to the second embodiment. A semiconductor memory card 31 shown in FIG. 5 is used as, for example, a micro SD™ standard memory card similarly as in the first embodiment. The memory card 31 has a planar structure which is basically the same as that of FIG. 1 and its illustration is omitted. It should be noted that the planar structure of the memory card 31 is described with reference to FIG. 1. It is to be understood that like parts corresponding to those of the first embodiment are denoted by like reference numerals and descriptions will be omitted.

The memory card 31 is provided with a first chip group 32, a second chip group 33, a third chip group 34 and a fourth chip group 35 which are arranged on the chip mounting section 8 of the wiring board 2. Four memory chips 36 which configure the first chip group 32 are stacked in a step-like shape on the second surface 2b of the wiring board 2. The first chip group 32 has substantially the same structure as the first chip group 13 of the first embodiment. Four memory chips 37 which configure the second chip group 33 are stacked in a step-like shape on the first chip group 32 in a direction opposite to the first chip group 32. The second chip group 33 has substantially the same structure as the second chip group 14 of the first embodiment.

Four memory chips 38 which configure the third chip group 34 are stacked on the second chip group 33. The third chip group 34 has substantially the same structure as that of the first chip group 32. The memory chips 38 which configure the third chip group 34 are stacked in a step-like shape in a direction opposite to the second chip group 32. Four memory chips 39 which configure the fourth chip group 35 are stacked on the third chip group 34. The fourth chip group 35 has substantially the same structure as that of the second chip group 33. The memory chips 39 configuring the fourth chip group 35 are stacked in a step-like shape in a direction opposite to the third chip group 34.

The electrode pads of the memory chips 36 to 39 configuring the first to fourth chip groups 32 to 35 are electrically connected to the connection pads of the wiring board 2 through first to fourth metal wires 40 to 43 respectively. In addition, the controller chip 15 is arranged on the fourth chip group 35. The controller chip 15 is electrically connected to the connection pads of the wiring board 2 through fifth metal wires 44. The configuration such as an arrangement shape of the electrode pads of the memory chips 36 to 39 and the controller chip 15 is determined to be the same as in the first embodiment.

As described above, since the stepped directions of the chip groups 32 to 35 arranged on the wiring board 2 are determined to be sequentially opposite directions, the number of the chip groups 32 to 35 can be increased without increasing a chip occupied area of the wiring board 2. Therefore, the number of the memory chips which are arranged in the chip mounting area (area where the chips can be mounted in practice) of the wiring board 2 can be increased. In other words, the memory card 31 which is small and has high capacity can be provided. For example, a total of 16 memory chips 36 to 39 which are realized to have a 2-GB storage capacity by applying the multilevel technology can be used to realize a 32-GB micro SD™ card (memory card 31).

The memory cards 1, 31 of the first and second embodiments are effective for the casing-less semiconductor memory card which is configured by the sole use of them, but a semiconductor memory card using a casing such as a base card is not excluded necessarily. In addition, the structures of the semiconductor memory cards of the embodiments can also be applied to the semiconductor memory device other than the memory card. The structures of the embodiments can also be applied to a semiconductor memory device having a BGA package or an LGA package. The semiconductor package is determined to have the same basic structure as that of the memory card except that the wiring board is provided with external connection terminals (ball terminals) which are formed of solder balls or the like.

The semiconductor memory device and the semiconductor memory card of the present invention are not limited to the above-described embodiments but can be applied to various types of semiconductor memory devices and memory cards which have plural chip groups comprised of memory chips having a single-long-side pad structure mounted on the wiring board. The structures of the semiconductor memory device and the semiconductor memory card can be modified in various ways if the basic structure of the invention is satisfied. Besides, the embodiments of the present invention can be expanded or modified within the scope of technical idea of the invention, and the expanded and modified embodiments are also included in the technical scope of the invention.

What is claimed is:

1. A semiconductor memory device, comprising:
a wiring board having a first surface provided with an external connection terminal, and a second surface provided with a chip mounting section and connection pads arranged on a first pad region along a first long side and a second pad region along a second long side;
a first chip, arranged to the chip mounting section of the wiring board, having first electrode pads arranged along a long side which is located near the first pad region;
a second chip, stacked on the first chip so as to expose the first electrode pads of the first chip, having second electrode pads arranged along a long side which is located near the second pad region;
first metal wires electrically connecting the connection pads arranged on the first pad region and the first electrode pads of the first chip;
second metal wires electrically connecting the connection pads arranged on the second pad region and the second electrode pads of the second chip; and
a sealing resin layer formed on the second surface of the wiring board to seal the first and second chips together with the first and second metal wires,
wherein the first chip has a power source terminal arranged at a corner portion of the first chip away from the first electrode pads.

2. The semiconductor memory device according to claim 1, wherein the first chip comprises a plurality of memory chips stacked, and the second chip is arranged to expose the first electrode pads of the uppermost memory chip in the first chip.

3. The semiconductor memory device according to claim 1, wherein the first chip comprises first, second and third memory chips stacked, and the power source terminal of the first memory chip and the power source terminal of the second memory chip are electrically connected by the first metal wire, and the power source terminals of the first and third memory chips and the connection pads are electrically connected by the first metal wires.

4. A semiconductor memory card, comprising:

a wiring board having a first surface provided with an external connection terminal, and a second surface provided with a chip mounting section and connection pads arranged on a first pad region along a first long side and a second pad region along a second long side;

a first chip, arranged to the chip mounting section of the wiring board, having first electrode pads arranged along a long side which is located near the first pad region;

a second chip, stacked on the first chip so as to expose the first electrode pads of the first chip, having second electrode pads arranged along a long side which is located near the second pad region;

a controller chip, stacked on the second chip, having third electrode pads arranged along at least one outline side;

first metal wires electrically connecting the connection pads arranged on the first pad region and the first electrode pads of the first chip;

second metal wires electrically connecting the connection pads arranged on the second pad region and the second electrode pads of the second chip;

third metal wires electrically connecting the connection pads of the wiring board and the third electrode pads of the controller chip; and a sealing resin layer formed on the second surface of the wiring board to seal the first and second chips and the controller chip together with the first, second and third metal wires, wherein the first chip has a power source terminal arranged at a corner portion of the first chip away from the first electrode pads.

5. The semiconductor memory card according to claim 4, wherein the first chip comprises a plurality of memory chips stacked, and the second chip is arranged to expose the first electrode pads of the uppermost memory chip in the first chip.

6. The semiconductor memory card according to claim 4, wherein the first chip comprises first, second and third memory chips stacked, and the power source terminal of the first memory chip and the power source terminal of the second memory chip are electrically connected by the first metal wire, and the power source terminals of the first and third memory chips and the connection pads are electrically connected by the first metal wires.

* * * * *